(12) United States Patent
Madge

(10) Patent No.: US 6,532,431 B1
(45) Date of Patent: Mar. 11, 2003

(54) RATIO TESTING

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/194,134

(22) Filed: Jul. 12, 2002

(51) Int. Cl.⁷ .............................................. G06F 15/00
(52) U.S. Cl. ...................................................... 702/132
(58) Field of Search ................................ 324/754, 755, 324/758, 765; 714/30, 34, 726; 702/132; 438/15, 18

(56) References Cited

U.S. PATENT DOCUMENTS

| | | | |
|---|---|---|---|
| 5,732,209 A | * 3/1998 | Vigil et al. ................... | 714/30 |
| 5,926,027 A | * 7/1999 | Bumb et al. ................. | 324/755 |
| 6,032,268 A | * 2/2000 | Swoboda et al. ............. | 714/30 |
| 6,162,652 A | * 12/2000 | Dass et al. ................... | 438/18 |
| 6,400,173 B1 | * 6/2002 | Shimizu et al. ............. | 324/765 |

* cited by examiner

Primary Examiner—Kamini Shah
(74) Attorney, Agent, or Firm—Luedeka, Neely & Graham, PC

(57) ABSTRACT

A method of testing an integrated circuit. The thermal energy of the integrated circuit to adjusted to a first temperature, and a first set of electrical characteristics of the integrated circuit are sensed at the first temperature. The first set of electrical characteristics are recorded in association with an identifier for the integrated circuit. The thermal energy of the integrated circuit is adjusted to a second temperature, and a second set of electrical characteristics of the integrated circuit are sensed at the second temperature. The electrical characteristics of the second set correspond to the electrical characteristics of the first set. The second set of electrical characteristics are also recorded in association with the identifier for the integrated circuit. Ratios are created between the corresponding recorded electrical characteristics of the first set and the recorded electrical characteristics of the second set for the integrated circuit, as determined by the identifier for the integrated circuit. A first categorization is applied to the integrated circuit if the ratios are within a first limit range, and a second categorization is applied to the integrated circuit if the ratios are not within the first limit range.

20 Claims, 2 Drawing Sheets

RATIO TESTING

FIELD

This invention relates to the field of integrated circuit fabrication. More particularly, this invention relates to testing integrated circuits.

BACKGROUND

There is continual pressure for integrated circuits to be increasingly faster and increasingly more powerful. Both of these objectives tend to be influenced by the size of the integrated circuits. By fabricating smaller integrated circuits, electrical pathways are shorter and more devices are formed within a given space, which tends to result in a faster, more powerful integrated circuit. Thus, feature sizes of integrated circuits tend to be continually reduced. Current processing techniques are entering what is commonly called the very deep sub micron range, in which minimum feature sizes range from about one hundred nanometers to about one hundred and eighty nanometers or so.

At such small feature sizes, the integrated circuits perform differently than they do at larger feature sizes. Thus, processing methods and testing methods that were valid, reliable, and cost effective at larger feature sizes may no longer be so at the smaller feature sizes. For example, at the smaller feature sizes, parameters such as intrinsic leakage tends to increase to a level where traditional test limits cannot be reliably applied. More specifically, tests such as IDDq, minimum VDD (VDDmin), maximum VDD (VDDmax), and frequency are generally anticipated to have an end of utile life at very small feature sizes. The screening of very deep sub micron defects and subtle defects such as resistive paths and timing defects are therefore very difficult to screen and more likely to become test escapes and may cause failures in the end application.

Currently used procedures for IDDq testing, for example, include sensing IDDq at a first temperature and comparing the first sensed values to a first set of criteria, and then sensing IDDq at a second temperature and comparing the second sensed values to a second set of criteria. Devices with values that violate either of the two sets of criteria are flagged, such as for scrap. However, this old method does not provide a solution for monitoring the defects that show significantly different temperature characteristics from so-called good devices. This aspect becomes more important for small featured devices as the current levels of the good devices increase into the milliampere or ampere range.

What is needed, therefore, is a method of testing small featured integrated circuits, such as integrated circuits in the very deep sub micron range, whereby parameter tests such as IDDq, VDDmin, VDDmax, and frequency provide valid results.

SUMMARY

The above and other needs are met by a method of testing an integrated circuit. The thermal energy of the integrated circuit to adjusted to a first temperature, and a first set of electrical characteristics of the integrated circuit are sensed at the first temperature. The first set of electrical characteristics are recorded in association with an identifier for the integrated circuit. The thermal energy of the integrated circuit is adjusted to a second temperature, and a second set of electrical characteristics of the integrated circuit are sensed at the second temperature. The electrical characteristics of the second set correspond to the electrical characteristics of the first set. The second set of electrical characteristics are also recorded in association with the identifier for the integrated circuit. Ratios are created between the corresponding recorded electrical characteristics of the first set and the recorded electrical characteristics of the second set for the integrated circuit, as determined by the identifier for the integrated circuit. A first categorization is applied to the integrated circuit if the ratios are within a first limit range, and a second categorization is applied to the integrated circuit if the ratios are not within the first limit range.

In this manner, the potentially defective integrated circuits that have significantly different ratios than the intrinsically good integrated circuits are identified in a production worthy method of screening. The method can be used on tester or as a statistical post process. This provides a method of screening integrated circuits even when the intrinsic leakage of the technology increases to a level at which traditional test limits, such as those for IDDq, VDDmin, VDDmax, and frequency cannot be applied.

In various preferred embodiments of the invention, further processing of the integrated circuit is selectively accomplished when the first categorization is applied to the integrated circuit, and processing of the integrated circuit is selectively stopped when the second categorization is applied to the integrated circuit.

In one embodiment the first temperature is lower than the second temperature, and the thermal energy of the integrated circuit is adjusted to a first temperature by either cooling the integrated circuit or heating the integrated circuit. Alternately, the first temperature is higher than the second temperature, and the thermal energy of the integrated circuit is adjusted to the second temperature by either cooling the integrated circuit or heating the integrated circuit.

Most preferably, sensing the first set of electrical characteristics of the integrated circuit at the first temperature and sensing the second set of electrical characteristics of the integrated circuit at the second temperature includes sensing at least one of IDDq, VDDmin, VDDmax, and frequency. In a most preferred embodiment, the first limit range is a three sigma limit around an arithmetic mean of the ratios.

In a preferred embodiment, sensing the first set of electrical characteristics of the integrated circuit at the first temperature is accomplished at wafer sort and sensing the second set of electrical characteristics of the integrated circuit at the second temperature is accomplished at final test. The first set and second set of electrical characteristics are preferably recorded in association with the identifier for the integrated circuit by saving the characteristics on computer writable and readable media.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
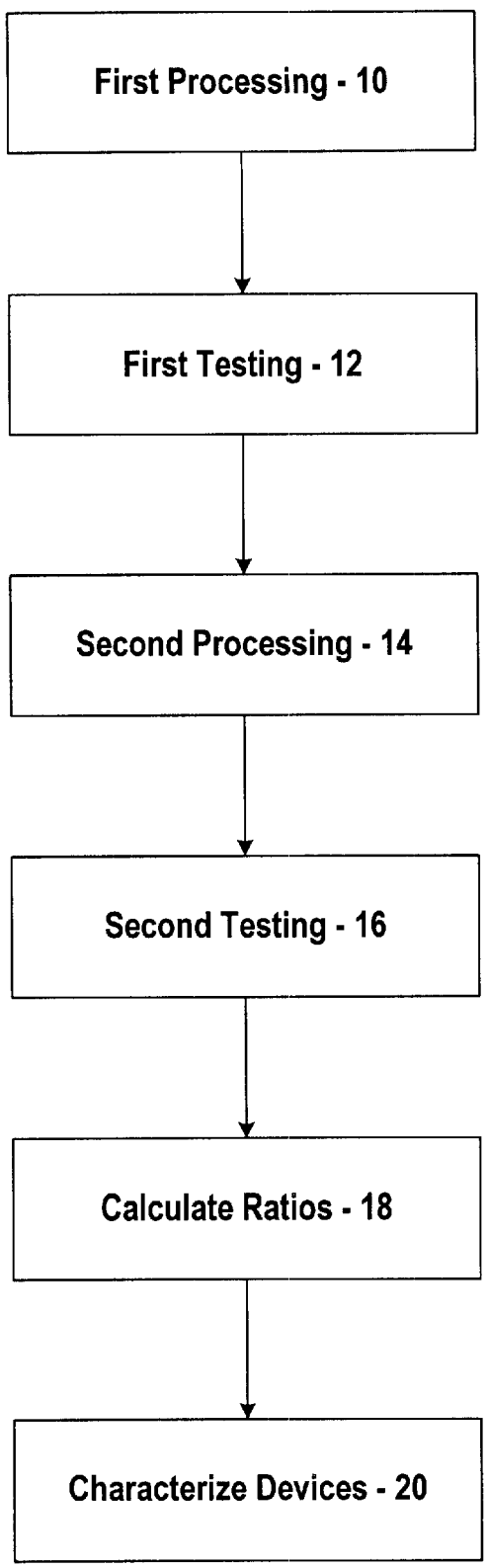
FIG. 1 depicts a flow chart of a method according to a preferred embodiment of the invention.

With reference now to FIG. 1, there is depicted a simplified flow chart showing the basic changes to a standard process flow for the fabrication of an integrated circuit according to a preferred embodiment of the present invention. Processing is accomplished on the integrated circuit, as given in block 10 of the flow chart. Most preferably, the processing for the integrated circuit is of the type that is often designated as front end processing, which preferably includes all steps required to complete the fabrication of the integrated circuit while it is in wafer form.

The integrated circuit is then tested as given in block 12. Most preferably this test is a part of what is typically referred to as wafer sort, in which a number of electrical characteristics of the integrated circuit are sensed, such as by physically probing the integrated circuit while it is in wafer form. In a most preferred embodiment, this first testing is accomplished at a first temperature, such as on a temperature controlled chuck. The temperature may be either above or below room temperature, but in a preferred embodiment the temperature of the integrated circuit is adjusted to between about zero centigrade and about one hundred and twenty-five centigrade, and most preferably between about twenty-five centigrade and about eighty-five centigrade.

The results of the first test are preferably recorded, such as on a computer readable and writable media, such as magnetic or optical media. Most preferably, the test results are recorded in association with an identifier for the integrated circuit. The identifier preferably includes both a designation of the wafer on which the integrated circuit resides, and a designation of the location of the integrated circuit within the wafer. In this manner, the data from the tests can remain associated with the integrated circuit as further processing is accomplished or time elapses.

The integrated circuit is then preferably further processed, as given in block 14. To continue the example introduced above where the first processing is front end processing and the first testing is wafer sort, then the further processing of block 14 is preferably back end processing, such as dicing, mounting, wire bonding (or otherwise electrically connecting), and packaging the integrated circuit.

The integrated circuit is then tested again as given in block 16. Most preferably this test is a part of what is typically referred to as final test, in which a number of electrical characteristics of the integrated circuit are sensed, such as by physically socketing the integrated circuit while it is in a packaged form. In a most preferred embodiment, this second testing is accomplished at a second temperature, such as in a temperature controlled socket. The temperature may be either above or below room temperature, but in a preferred embodiment the temperature of the integrated circuit is adjusted to between about zero centigrade and about one hundred and twenty-five centigrade, and most preferably between about twenty-five centigrade and about eighty-five centigrade.

The results of the second test are preferably recorded, such as on a computer readable and writable media, such as magnetic or optical media, which is preferably the same media on which the results of the first test are recorded. Most preferably, the test results are recorded in association with the identifier for the integrated circuit, so that corresponding information from the first test and the second test can be correlated.

In alternate embodiments the second testing may be accomplished immediately after the first testing, or processing other than back end processing may be accomplished between the first and second testing. For example, both the first and second test may be accomplished at wafer sort, or at some other point during wafer processing, or the first and second test may alternately both be accomplished at final test, or at some other point during back end processing. However, most preferably the first test is accomplished after front end processing at wafer sort, and the second test is accomplished after back end processing at final test.

The test data from the first and second tests are correlated using the integrated circuit identifier. In other words, the first test results for a given test are correlated with the second test results for the same type of test. For example, specific IDDq, VDDmin, VDDmax, and frequency results at first test are correlated with the results of the same test at second test. After pairing the correlated test results, a ratio for the test results is calculated as given in block 18, such as by dividing the first test results for a given test by the second test results for the same test. As a very simplified example, if the result of the first test was 2 and the result of the second test for the same parameter or electrical characteristic was 4, then the calculated ratio in this example would be 0.5.

If the ratio for the integrated circuit is within a first limit range, then a first characterization is applied to the integrated circuit, and if the ratio for the integrated circuit is outside of the first limit range, then a second characterization is applied to the integrated circuit, as generally given in block 20. For example, if the ratio for the integrated circuit is within the first limit range, then the integrated circuit is preferably characterized as a passing device, and if the ratio for the integrated circuit is outside of the first limit range, then the integrated circuit is preferably characterized as a failing device. Passing devices are preferably further processed, such as for shipment and sale, and the processing of failing devices is preferably stopped, such as by being scrapped and sent to failure analysis.

Figure 2:
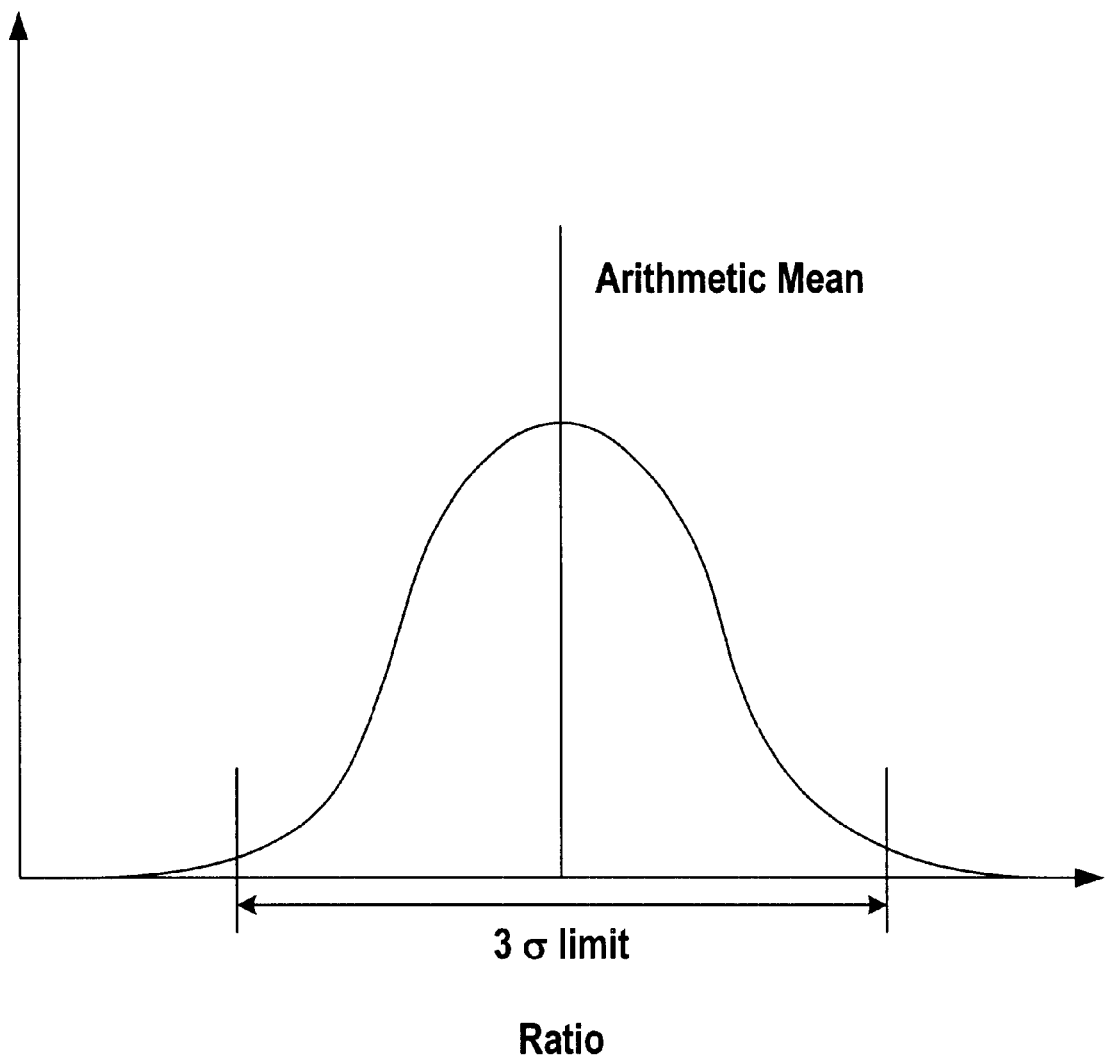
FIG. 2 depicts a chart of one method of forming a limit range for the characteristic ratios.

In a most preferred embodiment, the first limit range is determined by calculating a three sigma limit about an arithmetic mean for a group of integrated circuits, as depicted in FIG. 2. If the calculated ratio for a given integrated circuit falls within the three sigma limit, then the integrated circuit is preferably characterized with the first characterization, and if the calculated ratio for the given integrated circuit does not fall within the three sigma limit, then the integrated circuit is preferably characterized with the second characterization.

It is anticipated that different limits can also be used, and different characterizations can be applied. For example, integrated circuits having calculated ratios that fall with tighter limits, such as within a two sigma limit, may be characterized as acceptable for high tolerance applications and be given such a designation, whereas devices that do not fall with the two sigma limit, but do fall within the three sigma limit may be characterized as acceptable for standard tolerance applications, and be given such a designation. To continue the example, integrated circuits having calculated ratios that do not fall within the three sigma limits but which do fall within four sigma limits may be characterized as acceptable for low tolerance applications, and be given such a downgraded designation.

The group of integrated circuits from which the arithmetic mean is calculated may differ in various embodiments. For example, in one embodiment the group of integrated circuits from which the arithmetic mean is calculated contains the integrated circuits from a single wafer. In an alternate embodiment the integrated circuits come from a group of wafers that received similar processing, such as front end processing. In yet a further embodiment the group of integrated circuits comes from all integrated circuits processed within a given recent calendar period, such as within the six days most recently preceding the testing of the integrated circuit in question. Further, the group may be a running average of the last one hundred devices tested. Of course, other methods of selecting the group from which the average is computed are also comprehended.

Of course, other limits besides statistical limits could also be used, and even when statistical limits are used, other parameters besides the arithmetic mean and sigma deviations therefrom could be used to determine those limits. For example, the limits could be based upon the values of previously tested devices that have been life cycle tested and determined to function according to a given characterization, or based on data from characterizations of product performance to the end application.

It is further appreciated that other computed mathematical relationships besides the preferred embodiment of a ratio could be used. For example, ratios of combined sets of sensed parameters could be used. Additionally, the results of multiplied sensed parameters could also be used and analyzed for outliers. Further, the temperature at which the parameters are sensed could be used in the mathematical relationship that is analyzed for outliers. Thus, there are many different relationships that are comprehended in addition to the preferred embodiment of ratios.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of testing an integrated circuit, the method comprising the steps of:
    adjusting the thermal energy of the integrated circuit to a first temperature,
    sensing a first set of electrical characteristics of the integrated circuit at the first temperature,
    recording the first set of electrical characteristics in association with an identifier for the integrated circuit,
    adjusting the thermal energy of the integrated circuit to a second temperature,
    sensing a second set of electrical characteristics of the integrated circuit at the second temperature, where the electrical characteristics of the second set correspond to the electrical characteristics of the first set,
    recording the second set of electrical characteristics in association with the identifier for the integrated circuit,
    creating ratios between the corresponding recorded electrical characteristics of the first set and the recorded electrical characteristics of the second set for the integrated circuit, as determined by the identifier for the integrated circuit,
    applying a first categorization to the integrated circuit if the ratios are within a first limit range, and
    applying a second categorization to the integrated circuit if the ratios are not within the first limit range.

2. The method of claim 1, further comprising the steps of:
    selectively further processing the integrated circuit when the first categorization is applied to the integrated circuit, and
    selectively stopping processing of the integrated circuit when the second categorization is applied to the integrated circuit.

3. The method of claim 1, wherein the first temperature is lower than the second temperature.

4. The method of claim 1, wherein the step of adjusting the thermal energy of the integrated circuit to a first temperature comprises cooling the integrated circuit.

5. The method of claim 1, wherein the step of adjusting the thermal energy of the integrated circuit to a first temperature comprises heating the integrated circuit.

6. The method of claim 1, wherein the first temperature is higher than the second temperature.

7. The method of claim 1, wherein the step of adjusting the thermal energy of the integrated circuit to a second temperature comprises cooling the integrated circuit.

8. The method of claim 1, wherein the step of adjusting the thermal energy of the integrated circuit to a second temperature comprises heating the integrated circuit.

9. The method of claim 1, wherein the steps of sensing the first set of electrical characteristics of the integrated circuit at the first temperature and sensing the second set of electrical characteristics of the integrated circuit at the second temperature comprise sensing at least one of IDDq, VDDmin, VDDmax, and frequency.

10. The method of claim 1, wherein the first limit range is a three sigma limit around an arithmetic mean of the ratios.

11. The method of claim 1, wherein the step of sensing the first set of electrical characteristics of the integrated circuit at the first temperature is accomplished at wafer sort.

12. The method of claim 1, wherein the step of sensing the second set of electrical characteristics of the integrated circuit at the second temperature is accomplished at final test.

13. The method of claim 1, wherein the steps of recording the first set of electrical characteristics in association with the identifier for the integrated circuit and recording the second set of electrical characteristics in association with the identifier for the integrated circuit comprise saving the characteristics on computer writable and readable media.

14. The method of claim 1, wherein the first categorization comprises passing the integrated circuit for further processing and the second categorization comprises scrapping the integrated circuit.

15. A method of testing an integrated circuit, the method comprising the steps of:
    processing the integrated circuit in wafer form through front end processing,
    adjusting the thermal energy of the integrated circuit in wafer form to a first temperature,
    sensing a first set of electrical characteristics of the integrated circuit at the first temperature,
    recording the first set of electrical characteristics in association with an identifier for the integrated circuit, the identifier including a wafer designation and an integrated circuit location designation,
    dicing the integrated circuit to individualize the integrated circuit,
    processing the integrated circuit through back end processing,
    adjusting the thermal energy of the individualized integrated circuit to a second temperature, sensing a second set of electrical characteristics of the integrated circuit at the second temperature, where the electrical characteristics of the second set correspond to the electrical characteristics of the first set, recording the second set of electrical characteristics in association with the identifier for the integrated circuit, creating ratios between the corresponding recorded electrical characteristics of the first set and the recorded electrical characteristics of the second set for the integrated circuit, as determined by the identifier for the integrated circuit, applying a first categorization to the integrated circuit if the ratios are within a first limit range, and applying a second categorization to the integrated circuit if the ratios are not within the first limit range.

16. The method of claim 15, wherein the first temperature is lower than the second temperature.

17. The method of claim 15, wherein the steps of sensing the first set of electrical characteristics of the integrated circuit at the first temperature and sensing the second set of electrical characteristics of the integrated circuit at the second temperature comprise sensing at least one of IDDq, VDDmin, VDDmax, and frequency.

18. The method of claim 15, wherein the first limit range is a three sigma limit around an arithmetic mean of the ratios.

19. The method of claim 15, wherein the steps of recording the first set of electrical characteristics in association with the identifier for the integrated circuit and recording the second set of electrical characteristics in association with the identifier for the integrated circuit comprise saving the characteristics on computer writable and readable media.

20. A method of testing an integrated circuit, the method comprising the steps of:

processing the integrated circuit in wafer form through front end processing, adjusting the thermal energy of the integrated circuit in wafer form to a first temperature at wafer sort, sensing a first set of electrical characteristics of the integrated circuit at the first temperature, where the first set of electrical characteristics includes at least one of IDDq, VDDmin, VDDmax, and frequency, recording the first set of electrical characteristics in association with an identifier for the integrated circuit, the identifier including a wafer designation and an integrated circuit location designation, by saving the first set of characteristics on computer writable and readable media, dicing the integrated circuit to individualize the integrated circuit, processing the integrated circuit through back end processing, adjusting the thermal energy of the individualized integrated circuit to a second temperature at final test, sensing a second set of electrical characteristics of the integrated circuit at the second temperature, where the electrical characteristics of the second set correspond to the electrical characteristics of the first set, and the second set of electrical characteristics includes at least one of IDDq, VDDmin, VDDmax, and frequency, recording the second set of electrical characteristics in association with the identifier for the integrated circuit, by saving the second set of characteristics on the computer writable and readable media, computing mathematical relationships between the corresponding recorded electrical characteristics of the first set and the recorded electrical characteristics of the second set for the integrated circuit, as determined by the identifier for the integrated circuit, applying a first categorization to the integrated circuit if the mathematical relationships are within a first limit range, and applying a second categorization to the integrated circuit if the mathematical relationships are not within the first limit range.

* * * * *